United States Patent
Maiuzzo

(10) Patent No.: US 8,745,474 B2
(45) Date of Patent: Jun. 3, 2014

(54) METHOD AND APPARATUS FOR DETERMINING BITS IN A CONVOLUTIONALLY DECODED OUTPUT BIT STREAM TO BE MARKED FOR ERASURE

(71) Applicant: Michael Anthony Maiuzzo, Forest, VA (US)

(72) Inventor: Michael Anthony Maiuzzo, Forest, VA (US)

( * ) Notice: Subject to any disclaimer, the term of this patent is extended or adjusted under 35 U.S.C. 154(b) by 0 days.

(21) Appl. No.: 14/048,461

(22) Filed: Oct. 8, 2013

(65) Prior Publication Data

US 2014/0040708 A1    Feb. 6, 2014

Related U.S. Application Data

(63) Continuation-in-part of application No. 13/194,936, filed on Jul. 30, 2011, now Pat. No. 8,583,996.

(60) Provisional application No. 61/369,647, filed on Jul. 30, 2010.

(51) Int. Cl.
*H03M 13/03* (2006.01)
*H03M 13/29* (2006.01)
*H03M 13/37* (2006.01)
*H04L 1/00* (2006.01)

(52) U.S. Cl.
CPC ........ *H03M 13/2936* (2013.01); *H03M 13/373* (2013.01); *H04L 1/0059* (2013.01); *H04L 1/0054* (2013.01)
USPC ........... 714/795; 714/784; 714/785; 375/219; 375/295

(58) Field of Classification Search
CPC ................... H03M 13/4107; H03M 13/2936
USPC ............... 714/784, 785, 795; 375/262, 341
See application file for complete search history.

(56) References Cited

U.S. PATENT DOCUMENTS

| | | | | |
|---|---|---|---|---|
| 6,836,506 | B2 * | 12/2004 | Anderson | 375/145 |
| 7,003,045 | B2 * | 2/2006 | Morgan et al. | 375/265 |
| 7,050,419 | B2 * | 5/2006 | Azenkot et al. | 370/347 |
| 7,080,009 | B2 * | 7/2006 | Proctor et al. | 704/221 |
| 7,093,188 | B2 * | 8/2006 | Maiuzzo et al. | 714/795 |
| 7,228,489 | B1 * | 6/2007 | Boyer | 714/784 |
| 7,814,398 | B2 * | 10/2010 | Djurdjevic et al. | 714/784 |
| 7,900,125 | B1 * | 3/2011 | Liu et al. | 714/799 |
| 8,407,563 | B2 * | 3/2013 | Karabed et al. | 714/769 |
| 8,433,975 | B2 * | 4/2013 | Hekstra et al. | 714/760 |

\* cited by examiner

*Primary Examiner* — Esaw Abraham
(74) *Attorney, Agent, or Firm* — Traverse Legal, PLC

(57) ABSTRACT

A method and apparatus are provided for determining bits in a convolutionally decoded output bit stream to be marked for erasure. K-bits and p-bits of the convolutionally encoded output bit stream may be compared with a corresponding k-bits and p-bits of a delayed version of the input bit stream. For each bit of the k-bits (p-bits) in the convolutionally encoded output bit stream and in the corresponding k-bits (p-bits) of the delayed version of the input bit stream, a number of or pattern of conflicting bits and whether the number of conflicting bits exceeds a threshold number or pattern of conflicting bits may be determined. The output bit stream may be sent to a block decoding component for decoding with the k-bit streams marked for erasure.

30 Claims, 7 Drawing Sheets

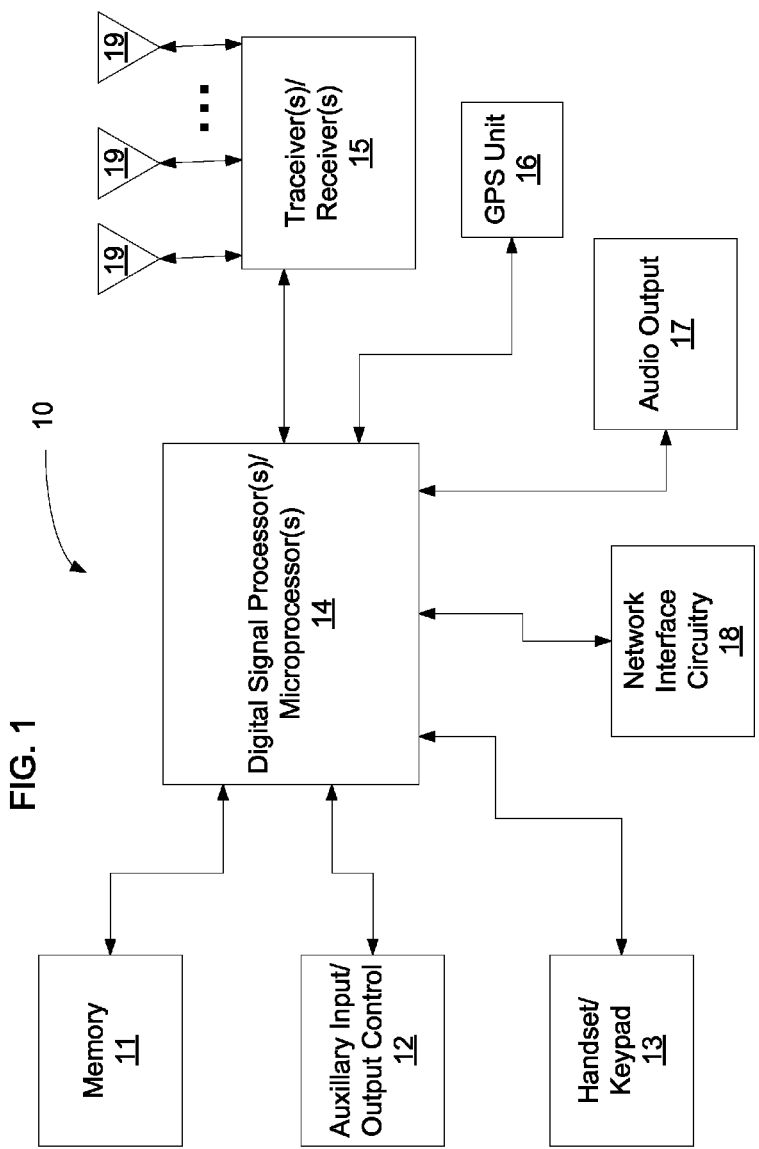

METHOD AND APPARATUS FOR DETERMINING BITS IN A CONVOLUTIONALLY DECODED OUTPUT BIT STREAM TO BE MARKED FOR ERASURE

STATEMENT OF RELATED APPLICATIONS

This application is a non-provisional continuation-in-part application, which claims the benefit of and priority to U.S. utility application U.S. Ser. No. 13/194,936 filed Jul. 30, 2011 that has issued as U.S. Pat. No. 8,583,996, which claims the benefit of priority from U.S. provisional application U.S. Ser. No. 61/369,647, entitled "Forward Error Correction Decoding," filed Jul. 30, 2010, the content of which is incorporated herein by reference in its entirety.

FIELD OF THE DISCLOSURE

The present disclosure relates to Forward Error Correction (FEC) decoding of data transmissions, and specifically to systems and methods of predicting when a decoding process will fail to correct an error burst within a transmission.

BACKGROUND

Forward Error Correction (FEC) refers to techniques of transmitting encoded data using additional redundancy data or error-correction data to allow a receiver to decode, detect, and/or correct transmission errors in the data without needing to request a retransmission of the data. Certain FEC encoding techniques, such as Reed-Solomon coding and other block codes, may be performed on fixed length blocks of data of predetermined size, while other FEC encoding techniques, such as convolutional coding, may be performed on bit streams of arbitrary length.

Many modern communication systems provide digital error control by using a FEC implementation that concatenates a convolutional encoding technique and a Reed-Solomon encoding technique. When decoding transmissions encoded with both Viterbi and Reed-Solomon FEC algorithms, a Viterbi decoder is employed first because Viterbi is the inner code. The Reed-Solomon, as the outer code, is decoded second. Certain Reed-Solomon implementations employ erasure capabilities, which have the capacity to correct twice the number of symbol errors as Reed-Solomon implementations without erasure capabilities. However, in a concatenated Viterbi and Reed-Solomon decoding system, the Reed-Solomon code typically does not employ erasure. For such concatenated systems, the reason for the lack of erasure capability in the Reed-Solomon code is that there should be a very high confidence that the transmission symbols are in error before they should be erased. For example, if only half of the erasures were actually in error and half of the erasures had been corrected by the Viterbi decoding, then a soft decision improvement of Reed-Solomon erasure would be entirely negated.

Viterbi decoding is generally effective at correcting randomly-spaced single errors in a transmission bit stream. However, Viterbi decoding may not be successful in correcting certain digital error bursts due to pulses and fades. Such error bursts may be caused by interference bursts emitted by radars and from signal outages due to signal fading. Although Viterbi decoding is capable of correcting certain digital error bursts, it will fail to correct many other such error bursts. Reed-Solomon decoding is generally good at correcting error bursts.

SUMMARY

In light of the foregoing background, the following presents a simplified summary of the present disclosure in order to provide a basic understanding of some aspects of the present disclosure. This summary is not an extensive overview of the present disclosure. It is not intended to identify key or critical elements of the present disclosure or to delineate the scope of the present disclosure. The following summary merely presents some concepts of the present disclosure in a simplified form as a prelude to the more detailed description provided below.

Aspects of the present disclosure are directed to a method and system to predict when a decoding process will fail to correct an error burst within a transmission. A decoder may receive an input bit stream and process it to produce an output bit stream, which may be convolutionally encoded. K-bits of the convolutionally encoded output bit stream may be compared with a corresponding k-bits of a delayed version of the input bit stream, with the k-bits starting at a first bit and ending at first bit+k. For each bit of the k-bits in the convolutionally encoded output bit stream and in the corresponding k-bits of the delayed version of the input bit stream, a number of conflicting bits and whether the number of conflicting bits exceeds a threshold number of conflicting bits may be determined. The output bit stream may be sent to a block decoding component for decoding with the bits marked for erasure.

Further aspects of the present disclosure are directed to a method and system for a forward error correction decoder and system to predict when a decoding process will fail to correct an error burst within a transmission. A bit stream encoded with a Reed-Solomon encoding concatenated with a convolutional encoding technique may be received. A state transition within the bit stream inconsistent with the convolutional encoding technique may be identified. Based on the identifying, at least one bit within the bit stream may be marked for erasure by a block decoding component. Indicators for the identification may include detecting bimodally-distributed samples from an ADC, with a significant number at or near the maximum ADC output level, comparing the correlation of ADC output samples with generic bimodal and unimodal Gaussian distributions to enable the declaration of a fading event, and/or using a sliding window of around 8 to 16 bits to create short term averages to help identify the erasure boundaries.

Aspects of the present disclosure may be provided in a non-transitory computer-readable medium having computer-executable instructions to perform one or more of the process steps described herein.

These and other aspects of the embodiments are discussed in greater detail throughout this disclosure, including the accompanying drawings.

BRIEF DESCRIPTION OF THE DRAWINGS

A more complete understanding of aspects of the present disclosure and the advantages thereof may be acquired by referring to the following description in consideration of the accompanying drawings, in which like reference numbers indicate like features, and wherein:

FIG. 1 illustrates a schematic diagram of a computerized system for implementing a FEC decoder in which certain aspects of the present disclosure may be implemented;

DETAILED DESCRIPTION

Figure 2A:
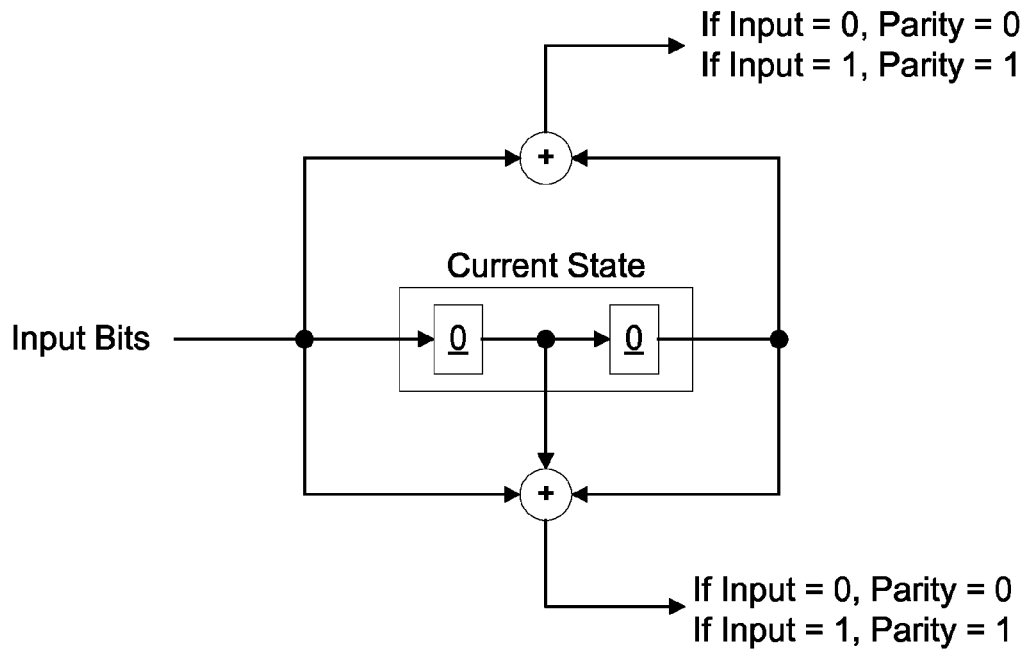
FIGS. 2A-2D are set of illustrative diagrams of a four-state machine equivalent to a convolutional encoder referred to as constraint length 3 and rate $^x\!A$ that may be used with the processes and functions of certain embodiments of the present disclosure.

In the following description of the various embodiments, reference is made to the accompanying drawings, which form a part hereof, and in which is shown by way of illustration, various embodiments in which the disclosure may be practiced. It is to be understood that other embodiments may be utilized and structural and functional modifications may be made.

Various aspects described herein may be embodied as a method, a data processing system, and/or a computer program product. Accordingly, those aspects may take the form of an entirely hardware embodiment, an entirely software embodiment and/or an embodiment combining software and hardware aspects. Furthermore, such aspects may take the form of a computer program product stored by one or more non-transitory computer-readable storage media having computer-readable program code, or instructions, embodied in or on the storage media. The term "computer-readable medium" or "computer-readable storage medium" as used herein includes not only a single medium or single type of medium, but also a combination of one or more media and/or types of media. Such a non-transitory computer-readable medium may store computer-readable instructions (e.g., software) and/or computer-readable data (i.e., information that may or may not be executable). Any suitable computer readable media may be utilized, including various types of tangible and/or non-transitory computer readable storage media such as hard disks, CD-ROMs, optical storage devices, magnetic storage devices, and/or any combination thereof.

As discussed above, in a concatenated Viterbi and Reed-Solomon decoding, the Reed-Solomon code typically does not employ erasure capabilities due to the lack of confidence that the transmission bits are in error. However, if the Reed-Solomon decoding could be assured that a burst of transmission bits was about 50% in error, it could employ erasure to correct many more bit errors and improve the overall decoding quality. Further, as a result of improved decoding, the required signal strength of transmission can be reduced significantly without degradation in signal quality (e.g., the signal-to-noise ratio).

Therefore, there remains a need to predict with accuracy and efficiency when a Viterbi decoding process will fail to correct an error burst within a transmission.

Referring to FIG. 1, a computerized system 10 may be configured for implementing a FEC decoder in accordance with one or more features of the present disclosure. In the example system of FIG. 1, the decoder with computerized system 10 may include one or more digital signal processor(s)/microprocessor(s) 14 and one or more memories 11 storing software as computer executable instructions. The memory 11 may comprise any type or combination of read only memory (ROM) modules or random access memory (RAM) modules, including both volatile and nonvolatile memory such as disks. The digital signal processor(s)/microprocessor(s) 14 also may be operatively coupled to, for example, an auxiliary input/output control 12, a handset/keypad 13, a global positioning satellite (GPS) unit 16, an audio output 17, a network interface 18, for example a high speed wireless or wired network interface, and/or transmitter(s)/receiver(s) 15 coupled to one or more antennas 19.

Figure 2B:
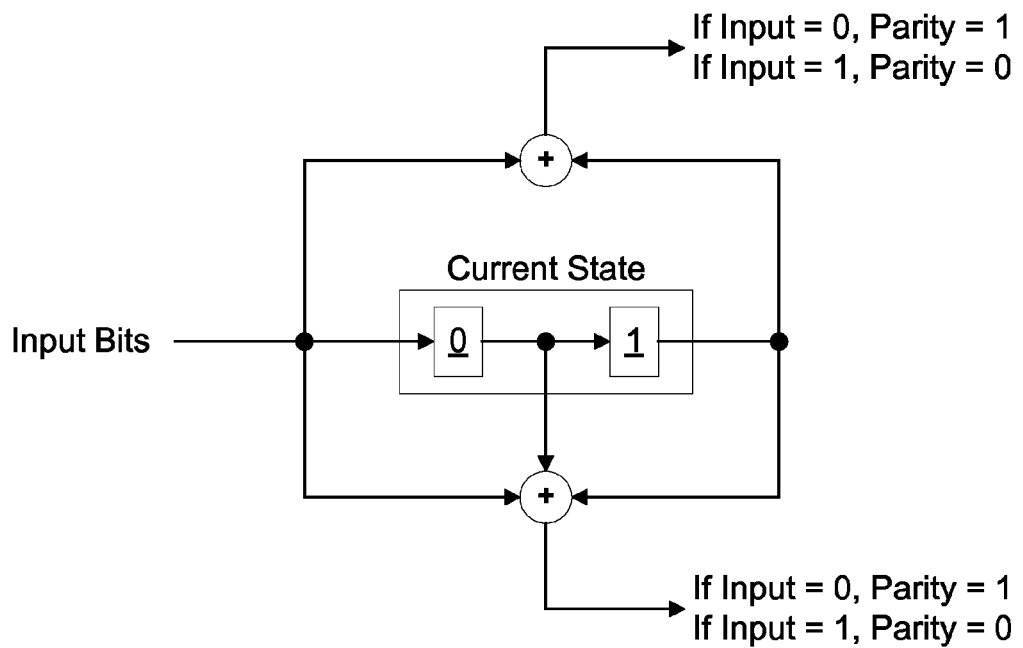
Figure 2C:
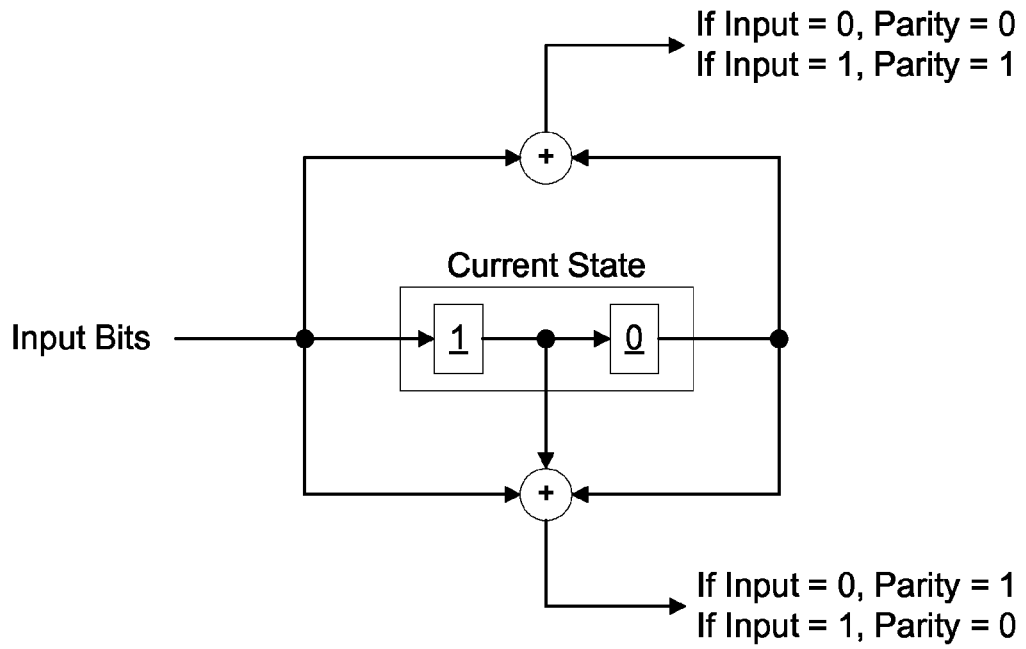
Figure 2D:
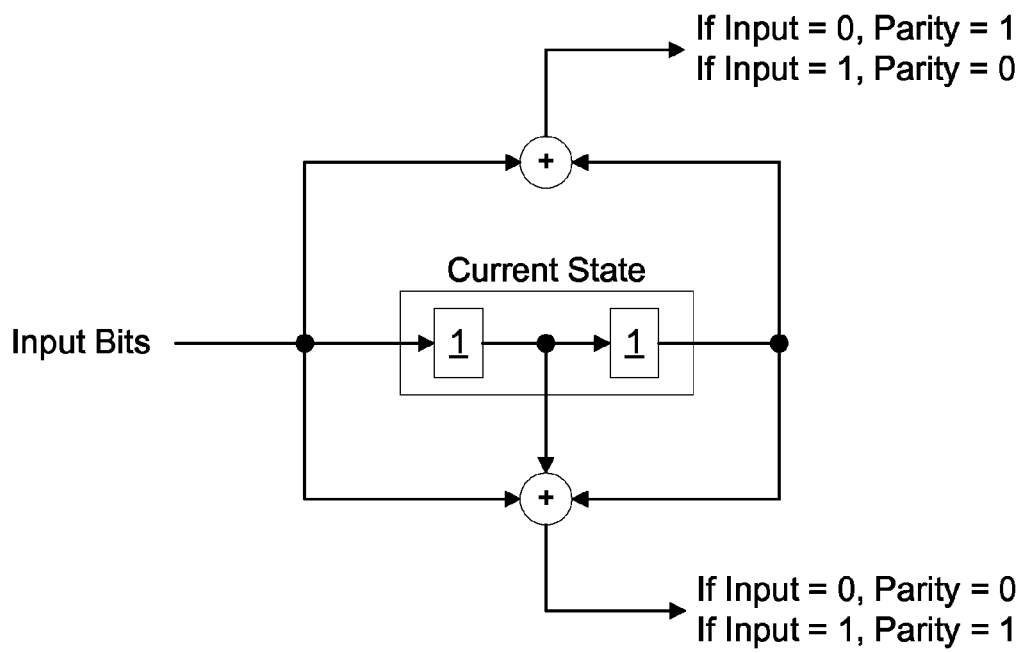

As discussed above, certain embodiments of the present disclosure relate to FEC decoding methods and systems using concatenated Viterbi and Reed-Solomon codes. In such examples, the Viterbi decoder may decode bit streams of arbitrary length encoded by a convolutional encoder. One characteristic of such convolutional encoders is that there is a precise succession of digital states in the bit streams. For example, referring to FIGS. 2A-2D, a set of diagrams is shown of a four-state machine equivalent to a convolutional encoder referred to as constraint length 3 and rate Vi. For example, FIG. 2A shows the machine in state defined by the bit pair (or state) "00." As shown in FIG. 2A, if the next input bit is a one, both parity output bits will be a "1." Additionally, if the next input bit is a one, the register bits will shift to the right, and the machine will move to state one-zero or "10" (see FIG. 2C). Alternatively, if the next input bit to the machine in the state of FIG. 2A is a zero, both parity output bits will be a "0," and the machine will remain in state zero-zero or "00." Note that there is no possibility that the next state of the machine following the state of FIG. 2A can be either "01" (FIG. 2B), or "11" (FIG. 2D).

As another example, typical Digital Video Broadcasts (DVB) use punctured versions of constraint length 7 rate Vx encoders. In the unpunctured case of DVB transmissions there would be 6 bits in each state rather than the two indicated in FIGS. 2A-2D for constraint length 3. The longer constraint length codes are used, for example, in many broadcast transmitters in producing "parity" data sequences for decoding in a receiver employing a Viterbi decoder. In the case of a code with constraint length 7 rate 14, there are 64 possible states. Yet given that a certain state exists at one instant, the next state may have a value of only one of two possible values. The other 62 states cannot reasonably occur.

Therefore, in accordance with certain aspects of the present disclosure, a Viterbi decoding process is performed. If a Viterbi decoding process identifies a sequence of two successive states that could not possibly have been generated at the transmitter, the two-bit sequence may be a highly likely candidate for an erasure pointer of a following Reed-Solomon decoder. Aspects of the present disclosure include the estimation of the beginning and end points of an error burst relative to a point where the "impossible" state transition occurred.

During the Viterbi decoding process, when an impossible state transition is detected, one of three events has occurred: (1) the first bit of the impossible state transition is a member of an incorrect lattice path; (2) the second bit of the impossible state transition is a member of an incorrect lattice path; or (3) both the first bit and the second bit of the impossible state transition are members of incorrect lattice paths. Although an incorrect lattice path is generally marked by high Viterbi path-cost factors, these factors may frequently be high even when the output data are correctly decoded. Therefore, using high Viterbi path-cost factors alone might not be sufficient for Reed-Solomon erasure triggers.

In accordance with certain aspects of the disclosure herein, a Viterbi path always may have a length of > the "history" parameter "h." When a path ending at t=T has been determined to be an incorrect path by one of the methods contained herein, it indicates one bit error is likely to occur at the decision node: t1=T−h. This point may be referred to as a start point. Once the Viterbi decoding path gets off the correct path, errors are likely until it gets back on the correct path. The decision node where that occurs may be referred to as the end point. Realistically, the error burst may precede the impossible state transition (i.e., it jumps from the bad path to the good path.)

Accordingly, aspects of the disclosure provide additional methods for determining which bit (or bits) of the impossible state transition are members of bad lattice paths, and for identifying the end points of the bad lattice paths.

In certain embodiments, a process at a decoder may analyze the digitized samples of the analog to digital converter (ADC). In this example, the ADC may be part of a system that employs an automatic gain control circuit (AGC) that is used to maintain the desired signal several dB or more within the confines of the dynamic range of the ADC. The analysis of the statistics of the ADC samples may allow the determination of the end points of an interference burst or a signal fade. A similar criteria would detect bimodally-distributed samples from the ADC, with a significant number at or near the maximum ADC output level. This could be accomplished using a sliding window detector. This would imply a sudden noise burst for which the AGC has not had time to react, e.g., a radar pulse.

A signal fade may be identified by a sudden drop in the ADC rms level. The short-term signal-to-noise power ratio (SNR) may be needed to determine the need for erasure of corresponding Reed-Solomon bits/symbols. The noise level will tend to remain constant as the signal level fades. Therefore, in this example, this "instantaneous" SNR may be determined from the short-term bit-error-rate. Additionally, a standard Viterbi feedback method may be employed to determine the short-term bit-error-rate in time periods that have a low ADC "clipping" frequency. The correlation of these events with "impossible" transitions in the Viterbi algorithm's output signal may be determined. Another indicator of this fading event is the amplitude probability distribution (APD) of the samples taken from the output of the ADC circuit. The APD will change from a bimodal APD to a unimodal Gaussian APD. Comparing the correlation of the ADC output samples with generic bimodal and unimodal Gaussian distributions enables the declaration of a fading event.

In other examples, the soft decision outputs of a Shortened Soft Output Viterbi Algorithm (SSOVA) may be used. These are similar to standard SOVA metrics, except that the metrics are evaluated over a short time window (8 to 16 time steps typically) rather than the normal path history parameter. SSOVA metrics before the impossible state transition may be compared to the SSOVA metric outputs after the impossible state transition. In this example, the bits on one side of the impossible state transition (i.e., before or after) may be marked for erasure during the Reed-Solomon decoding.

The standard Viterbi approach typically uses the least cost path to generate the maximum likelihood output bit. The standard SOVA does the same, except that it first compares (subtracts) the path cost of the selected (least cost) path with the path cost of the next highest path cost and uses the cost difference to generate a confidence factor as a metric. It then may average the confidence factors over a relatively long period of time to create an averaged confidence factor.

In this case we may use a sliding window of around 8 to 16 bits to create short term averages. These are used to help identify the erasure boundaries. Thus, one boundary of an error burst marked for erasure corresponds to the bit pair marking the impossible transition.

When the systems and methods described herein are applied, the required signal strength in a Rician fading environment may be reduced by at least about 3 dB. Further, improvement may be much greater in radar interference, for example, a 30 dB reduction has been observed.

Figure 3:
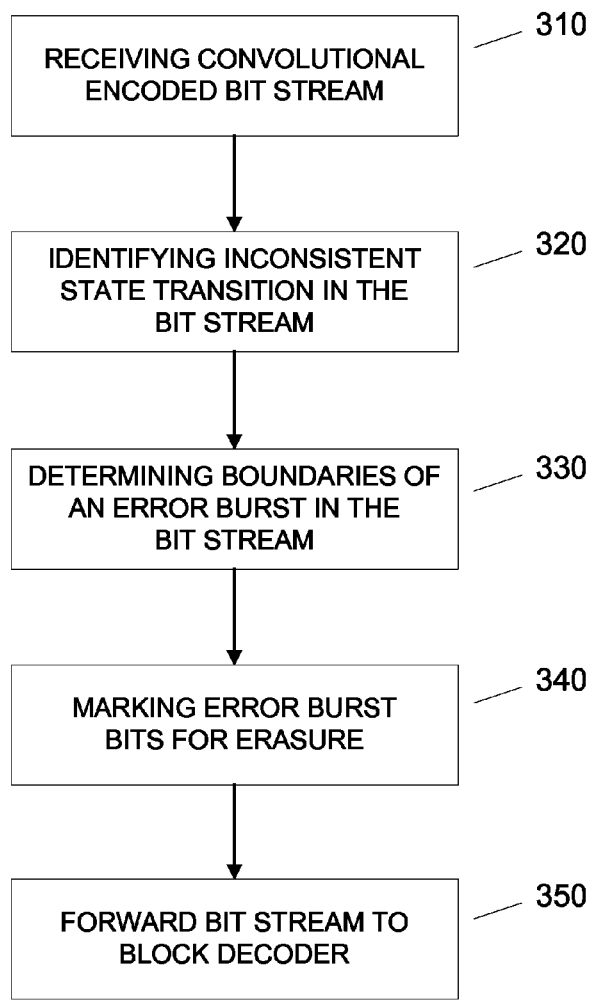
FIG. 3 is a flowchart of an illustrative method for decoding a forward error correction encoded transmission in accordance with at least one aspect of the present disclosure.

FIG. 3 is a flow diagram illustrating a method of decoding a forward error correction encoded transmission, in accordance with one or more of the above-described embodiments of the present disclosure. In step 310, a convolutional encoded bit stream transmission may be received at a computing device, for example, a forward error correction (FEC) decoder 10. As discussed above, the encoded bit stream may be a concatenated convolutional and Reed-Solomon encoding. Thus, the Viterbi (or other convolutional) decoding may be performed before the Reed-Solomon (or other block) decoding. In step 320, the decoder 10 may identify an inconsistent state transition within the bit stream. In certain examples, step 320 may include performing a Viterbi decoding process at the decoder 10, and identifying a decoded bit sequence that contradicts the rules of the convolutional encoding process. In step 330, the decoder 10 may determine first and second (i.e., starting and ending) boundaries of an error burst within the bit stream. As described above, the Viterbi algorithm is generally effective at correcting single errors, but might not be effective at correcting error burst, or bit sequences containing several closely-spaced errors. Accordingly, the starting and ending boundaries of an error burst may be identified in step 330 using one or more of the techniques described above. In step 340, the bits identified as being within the error burst may be marked for the Reed-Solomon decoder (or other block decoder). In certain examples, the Viterbi decoder may mark the symbols (i.e., 8-bit sequences) having an error for erasure, so that the Reed-Solomon decoder may ignore any marked symbols when decoding code words consisting of multiple symbols (e.g., 204 symbols/code word). Finally, in step 350, the marked symbols may be forwarded to the Reed-Solomon decoder employing erasure for block decoding. Reed Solomon decoders with erasure capability typically have 9-bit symbols instead of 8, whereby setting the $9^{th}$ bit high marks the symbol (the other 8 bits) for erasure.

Several other indicators may be used to identify low quality time steps. One of these indicators is a time step whereby the lowest cost state has a cost that is nearly the same as the state with the next to lowest cost. To evaluate the need for a Reed Solomon erasure event, a sliding window of duration, e.g., 16 time steps, has a relatively high fraction of those meeting this indicator.

A second indictor may rely on the amplitude probability distribution (APD) of the voltage samples from the ADC. For example, if the SNR is very high it would be almost certain, with a properly functioning AGC circuit, that the voltage samples will be almost precisely either +1v or −1v. With a lower SNR, the samples will look like bimodal Gaussian distributions with modes centered on +1v and −1v. As the SNR drops further, the distribution of the samples will look like a unimodal Gaussian distribution centered at zero volts. A sliding window that detects a high percentage of samples with a unimodal-like distribution may be used also.

A third indicator may detect bimodally-distributed samples from the ADC, with a significant number at or near the maximum ADC output level. This could be accomplished using a sliding window detector. This would imply a sudden noise burst for which the AGC has not had time to react, e.g., a radar pulse. Still another indicator may detect, using a sliding window detector, bits leaving the signal soft decision detector with a preponderance of mid-range quality ratings.

Figure 4:
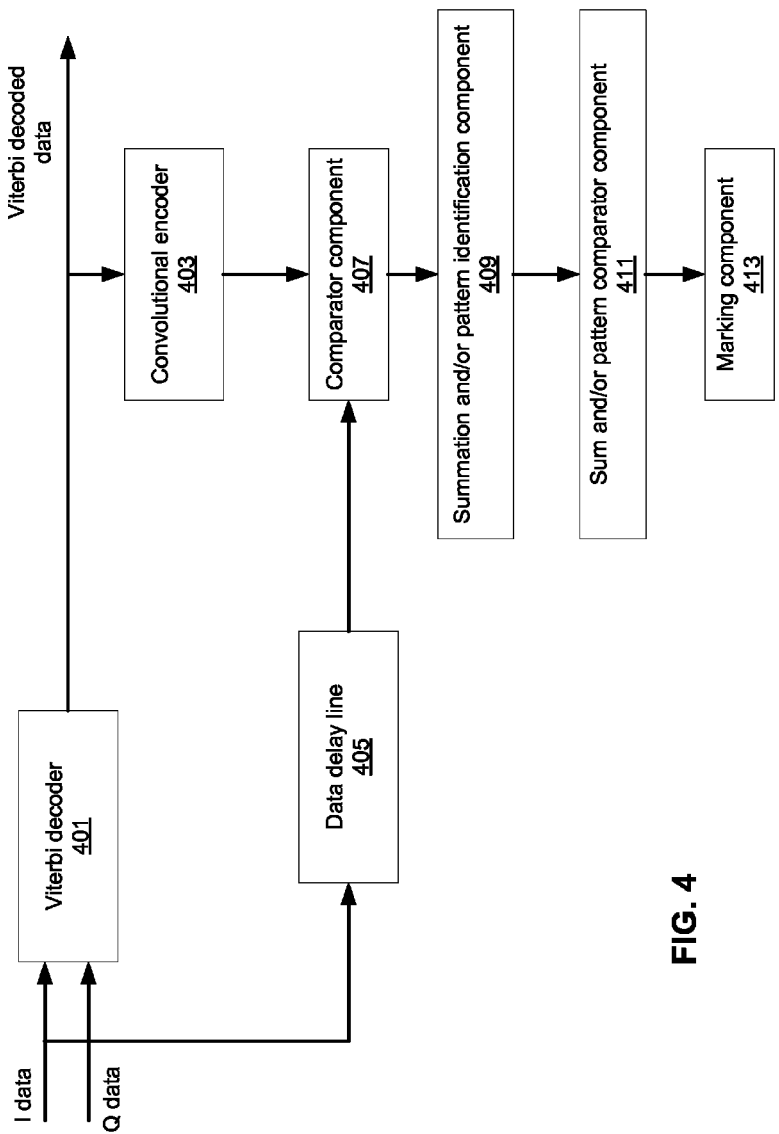
FIG. 4 illustrates a schematic diagram of a computerized system for implementing a decoder in which certain aspects of the present disclosure may be implemented.
Figure 5:
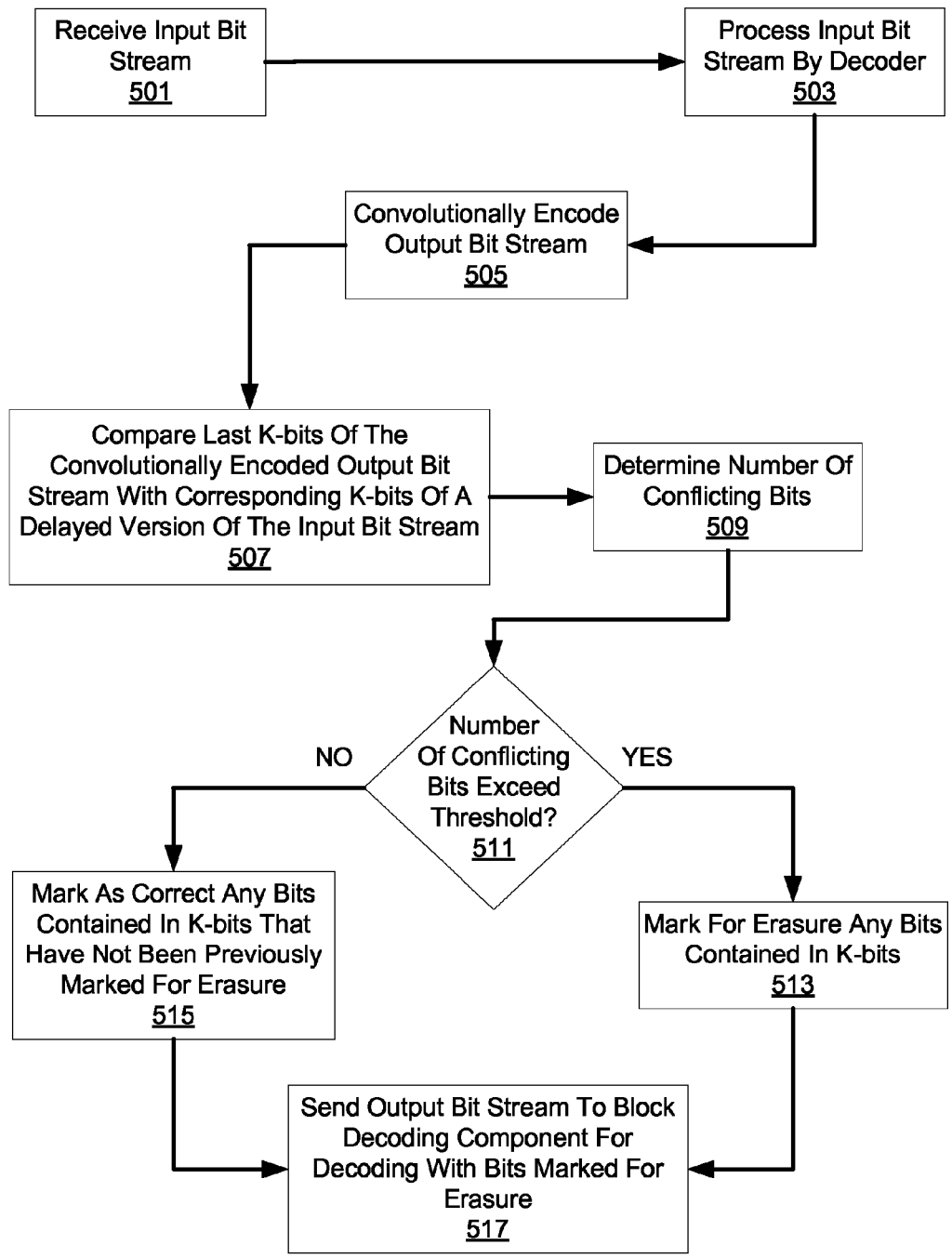
FIG. 5 is a flowchart of an illustrative method for decoding an encoded transmission in accordance with at least one aspect of the present disclosure.

FIG. 4 illustrates a schematic diagram of a computerized system for implementing a decoder in which certain aspects of the present disclosure may be implemented. FIG. 5 is a flowchart of an illustrative method for decoding an encoded transmission in accordance with at least one aspect of the present disclosure. Any one or all components in FIG. 4 may be on an ASIC and/or FPGA. In addition, one or more aspects of FIG. 5 may be implemented via firmware and/or software. The process starts and at 501 an input bit stream may be received. The input bit stream may be for a convolutional decoder, such as Viterbi decoder 401 in FIG. 4. When a bit arrives at the Viterbi decoder 401, it may be in the form of quadrature phase shift keying QPSK. It may be thought of as two parallel binary data streams, such as I data and Q data streams in FIG. 4. The two streams may be interleaved into a single bit stream as the input bit stream. At 503, the input bit stream may be processed into a decoded output bit stream. In the example of FIG. 4, the Viterbi decoder 401 may perform 503 and output a Viterbi decoded data stream as the output data stream.

Moving to 505, the output bit stream, which may be from the Viterbi decoder 401, may be convolutionally encoded. Process 505 may be performed by convolutional encoder 403 in FIG. 4. Proceeding to 507, a last k-bits of the convolutionally encoded output bit stream may be compared with a corresponding k-bits of a delayed version of the input bit stream. The delayed version of the input bit stream may be received from a data delay line, such as data delay line 405. The last k-bits may be configured to start at a first bit and end at first bit+k. As such, k-bit of serial data are compared as part of 507. Comparator component 407 may implement the process of 507.

In 509, a number of conflicting bits may be determined for each bit of the last k-bits in the convolutionally encoded output bit stream and in the corresponding k-bits of the delayed version of the input bit stream. If a conflict, i.e., difference, exists, the bit comparison may be identified as a "1," while if no conflict exists, the bit comparison may be identified as a "0." k may be any integer greater than 0. Illustrative examples of the value of k may include 4 bits, 8 bits, and 16 bits. One illustrative example for determining the number of conflicting bits in the last k-bits in 509 is to sum the number of conflicting bits. If there are no conflicting bits, e.g., all of the bits of the k-bits are identified by "0," the sum may be zero. If 4 of the bits of the k-bits conflict, e.g., are identified by "1," the sum may be 4. Summation and/or pattern identification component 409 may implement the process of 509.

Proceeding to 511, a determination may be made as to whether the number of conflicting bits exceeds a first threshold number of conflicting bits. One illustrative example for determining in 511 is to compare the number determined in 509 to a first threshold number. Sum and/or pattern comparator component 411 may implement the process of 511. The first threshold may be determined based upon the value of k. In an example where k has a value of 8, the first threshold may be 5 conflicting bits. Therefore, if the number of conflicting bits determined in 509 is 6, then the determination in 511 is that the first threshold, 5, was exceeded and the process may move to 513.

If the first threshold was exceeded, in 513, the bits contained in the last k-bits are marked for erasure. Marking component 413 may implement the process of 513. If the first threshold was not exceeded in 511, the process moves to 515 where the bits contained in the last k-bits that have not previously been marked for erasure are marked as correct. Marking component 413 may implement the process of 515. Once a bit has been marked for erasure, it cannot be changed back to marked as correct. Because the comparison of k-bits may repeat for a new set of bits and because some of a first set of k-bits may be included in a new set of k-bits for comparison, a bit may initially be marked as correct during use in a first comparison but then may be marked for erasure when used in a later comparison. Following the marking in 513 or 515, the output bit stream may be sent to a block decoding component for decoding. The block decoding component may include an erasure capable Reed-Solomon decoder.

In one or more examples, the input data stream received in 501 may represent a combination of digitized noise, electromagnetic interference, and parity bits entering a Viterbi decoder for processing in 503. Ideally, the data stream leaving a convolutional encoder in 505 is identical to the data stream leaving the convolutional encoder in the transmitter. Conflicts in a comparator 407 may mean one of two things, either an error in the input data stream has been corrected or a correct bit in the input data stream has been changed to an incorrect value. The question arises as to which of these two conditions exist when a conflict occurs. If the latter, that bit should be marked for erasure, while if the former, that bit should not be marked for erasure.

A Reed Solomon codeword may consist of 204 8-bit symbols. A symbol is defined to be in error if any of its 8 bits is in error. It can correct a codeword with up to 8 symbols in error. In the case where all symbols with >0 errors can be identified and erased, a codeword with up to 16 erasures may be made correct. Thus with a strong indicator, the interference duty cycle can be doubled.

We do know that Viterbi is excellent at correcting some error patterns such as channel errors or conflicts separated by enough conflict-free bits. Also, Viterbi fails to correct channel errors if they are significantly bunched up. Aspects of the present disclosure look for a strong indicator of one or the other condition from the pattern of conflicts coming from the comparator. With a good database of conflict patterns and their effects, the interference duty cycle can be doubled with no cost in bandwidth, data rate, or any other performance parameter.

Figure 6:
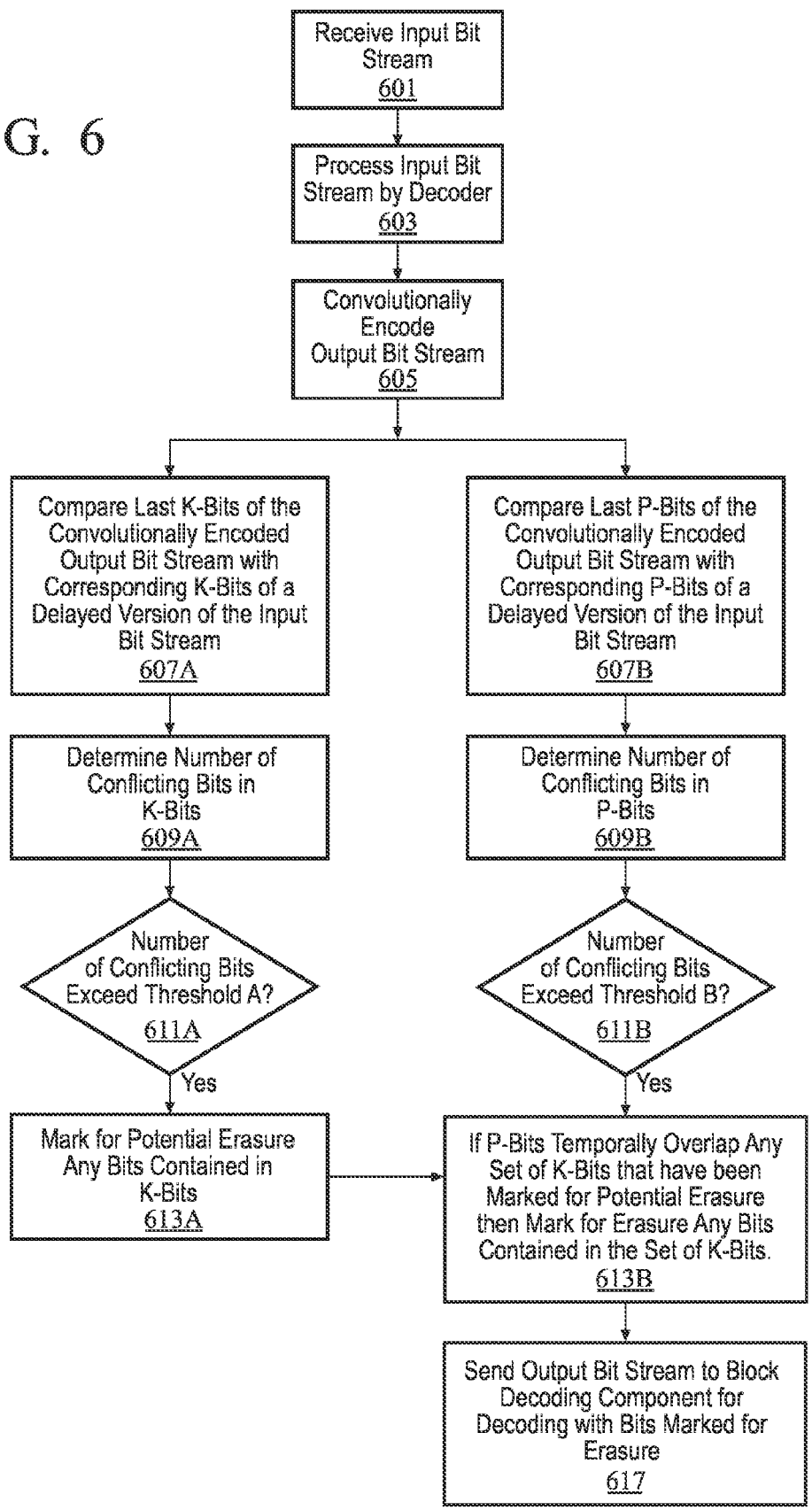
FIG. 6 is a flowchart of another illustrative method for decoding an encoded transmission in accordance with at least one aspect of the present disclosure.

FIG. 6 shows another illustrative method for decoding an encoded transmission in accordance with at least one aspect of the present disclosure. Block 601 indicates that an input bit stream is received. As described above with respect to FIG. 5, the input data stream received in 601 may represent a combination of digitized noise, electromagnetic interference, and parity bits entering a Viterbi decoder for processing in 503. Block 605 depicts that the output bit stream, which may be from the Viterbi decoder 401, may be convolutionally encoded. Process 605 may be performed by convolutional encoder 403 in FIG. 4. Ideally, the data stream leaving a convolutional encoder in 605 is identical to the data stream leaving the convolutional encoder in the transmitter.

In FIG. 6, the output of process 605 of the convolutional encoder may be examined simultaneously in 607A and 607B, by comparing sets of k-bits and p-bits, respectively with delayed versions of the decoder input bit streams 601. At block 607A, a last k-bits of the convolutionally encoded output bit stream may be compared with a corresponding k-bits of a delayed version of the input bit stream. The delayed version of the input bit stream may be received from a data delay line, such as data delay line 405. The last k-bits may be configured to start at a first bit and end at first bit+k. As such, k-bit of serial data are compared as part of 607A. Similarly, at block 607B, a last p-bits of the convolutionally encoded output bit stream may be compared with a corresponding j-bits of a delayed version of the input bit stream. The delayed version of the input bit stream may be received from a data delay line, such as data delay line 405. The last p-bits may be configured to start at a first bit and end at first bit+j. Comparator component 407 may implement the processes of 607A and 607 B.

The first set, the k-bit set, that is compared at 607A may be used for example to determine the beginning and end of the error burst. The second set, the p-bit set, is compared at 607B, and may be used to determine the probability that the conflicts will translate to actual errors.

As described above with reference to FIG. 5, at blocks 609A and 609B, a number of conflicting bits may be determined for each bit of the last k-bits and p-bits (respectively) in the convolutionally encoded output bit stream and in the corresponding k-bits and p-bits of the delayed version of the input bit stream. If a conflict, i.e., difference, exists, the bit comparison may be identified as a "1," while if no conflict exists, the bit comparison may be identified as a "0." k and/or p may be any integer greater than 0. Illustrative examples of the values of k and p may include 4 bits, 8 bits, and 16 bits. One illustrative example for determining the number of conflicting bits in the last k-bits in 609A (or p-bits in 609B) is to sum the number of conflicting bits. If there are no conflicting bits, e.g., all of the bits of the k-bits are identified by "0," the sum may be zero. If 4 of the bits of the k-bits conflict, e.g., are identified by "1," the sum may be 4. Certain code structures, such as the well-known Gray code provides additional probability information which allows "soft evaluations" to be made. Certain conflict patterns in Gray-coded signals are stronger predictors and may be used to increase the sum. Summation and/or pattern identification component 409 may implement the processes of 609A and/or 609B.

The conflicts are counted in block 609A and 609B. One or more or each conflict in a parity bit may be an indication that the number of conflicts is approaching a value such that the Viterbi will fail, if Viterbi coding is used, and erasures are recommended and/or needed. Another, though arguably less-useful, measure is the evaluation of signal to noise ratio.

Gray coding has been designed so that if a high proportion of the bits in a Gray-coded symbol are uncertain in value, the entire symbol is likely in error. For example if both bits of a 2-bit Gray coded symbol are in conflict, they may be counted as three conflicts (instead of two) in one or more examples of the present application. Other examples may count it as two conflicts.

At 611A and 611B, it is determined whether the number of conflicting bits identified by 607A and 607B (respectively) exceed threshold A and threshold B (respectively). If both thresholds A and B are exceeded the first set may be used for example, to define the erasure bounds.

Threshold A may be determined based upon the value of k. In an example where k has a value of 8, the first threshold may be 5 conflicting bits. Therefore, if the number of conflicting bits determined in 609A is 6, then the determination in 611A is that the first threshold, 5, was exceeded and the process may move to 613A.

If the first threshold was exceeded, in 613A, the bits contained in the last k-bits are marked for potential erasure. Marking component 413 may implement the process of 613A. Alternatively, if the first threshold was not exceeded in 611A, the bits contained in the last k-bits that have not previously been marked for erasure are marked as correct.

At 613B, if the number of conflicting p bits exceeded Threshold B at 611B, and the number of conflicting k bits exceeded Threshold A at 611A, if the p bits temporally overlap any of the sets of k bits marked for potential erasure at 613A, then the k bits marked for potential erasure are marked for erasure.

As described above, once a bit has been marked for erasure, it cannot be changed back to marked as correct. Because the comparison of k-bits may repeat for a new set of bits and because some of a first set of k-bits may be included in a new set of k-bits for comparison, a bit may initially be marked as correct during use in a first comparison but then may be marked for erasure when used in a later comparison. Following the marking in 613B, the output bit stream may be sent to a block decoding component for decoding with bits marked for erasure, as shown at 617. The block decoding component may include an erasure capable Reed-Solomon decoder.

In accordance with one or more features of the present disclosure, the comparison of k-bits from the output data stream with corresponding k-bits from the delayed version of the input bit stream may be desired as a sliding window of k-bits. In one example where the comparison occurs for each new bit j=1, as each new bit of the output stream from a Viterbi decoder, such as in 507, is added, that bit and the previous k−1 bits may be compared against the corresponding k-bits from the delayed version of the input bit stream. As such, for j=1, a bit in the output bit stream may be compared k times. In an alternative embodiment when the shift in bits is j=2, a bit in the output bit stream may-be compared k/2 times since 2 new bits are added to the k-bits for each comparison. Each bit in the output bit stream may be compared k times or any particular number less than k. In addition, the comparison may occur once for every k-bits.

A second comparison may occur between a next k-bits of the convolutionally encoded output bit stream with the corresponding next k-bits of the delayed version of the input bit stream to the Viterbi decoder, where the next k-bits start after adding j bits and j may be any integer 1 or greater. Similar to 509, a number of conflicting bits may be determined for each bit of the next k-bits in the convolutionally encoded output bit stream and in the corresponding k-bits of the delayed version of the input bit stream. If a conflict, i.e., difference, exists, the bit comparison may be identified as a "1," while if no conflict exists, the bit comparison may be identified as a "0." k may be any integer greater than 0. Illustrative examples of the value of k may include 4 bits, 8 bits, and 16 bits.

A determination may be made as to whether the number of conflicting bits exceeds a second threshold number of conflicting bits. The second threshold number of conflicting bits may be the same as the first threshold in 511, 611A and/or 611B, or may be a different number of conflicting bits. One illustrative example for this determining is to compare the number of summed conflicting bits to the second threshold number. The second threshold may be determined based upon the value of k. In an example where k has a value of 8, the second threshold may be 5 conflicting bits. Therefore, if the number of conflicting bits determined is 6, then the determination is that the second threshold, 5, was exceeded.

If the second threshold was exceeded, the bits contained in the next k-bits are marked for erasure. If the second threshold was not exceeded, the bits contained in the next k-bits that have not previously been marked for erasure are marked as correct. Once a bit has been marked for erasure, it cannot be changed back to marked as correct. Following the marking, the output bit stream may be sent to a block decoding component for decoding.

The use of a k-bit window for comparison purposes as described herein may be implemented in a number of other manners in order to detect a pattern that may be identified as an error although individual k-bit sequences of bits where no recognized as an error burst. For example, the pattern of conflicting and non-conflicting bits in a k-bit window may be monitored for patterns know to be errors. In an example where k-bits are 8 bits, a specific sequence of conflicting and non-conflicting bits, such as "01110011" may be identified as a specific pattern that is a known error burst. In still other examples, a sequence of k-bits that exceeds a first threshold may trigger the monitoring of a certain number of following bits and/or sequences of bits to see if another known pattern occurs within a specific number of bits.

In such an example where k-bits are 8 bits, identification of a k-bit window that has conflicting bits exceeding a first threshold may trigger the monitoring of the next 20 bits to see if a specific sequence of bits occurs within the k-bit window. If such a sequence is identified, that group of k-bits may be identified as an error and marked for erasure even if the individual comparison of the k-bits against a threshold did not result in marking for erasure. In this example, the occurrence of the error burst previously initiated the monitoring of subsequent bits for a specific pattern.

The patterns as described herein may be implemented with respect to multiple windows that may all be k-bits in length and/or may be different lengths of bits. In one example, two windows may be utilized with one window being k-bits in length and a second window being m-bits in length, where k and m are different integers, such as 8 and 16. Thresholds for determining whether a number of conflicting bits in the k-bit window versus for determining whether a number of conflicting bits in the m-bit window may be different. In still other examples, the thresholds may be the same number. Summation and/or pattern identification component 409 and/or Sum and/or pattern comparator component 411 may implement one or more of these processes described. FIG. 6. illustrates one example of this implementation. In another example, if the values of k and m are the same, a single window (but using two threshold values and an additional output logic level, e.g., 0, 1 and 2 vs. 0 and 1) may accomplish the objectives of FIG. 6.

Signals are typically coded using codes that minimize the bit error rate. One such well-known code is called Gray code which provides additional error probability information. This information allows "soft evaluations" to be made of error probability. Certain conflict patterns in Gray-coded signals are strong predictors of a signal completely masked by noise. In Quadrature Phase Shift keying (QPSK) for example, in weak-noise conditions it is unlikely that both of the bits that make up a Gray-Coded QPSK (2-bit) symbol are in conflict or error. Thus, when both bits of Gray-coded QPSK channel symbols are in conflict for an extraordinary number of channel symbols in the window, the probability of "heavy noise" is high and the conflict count is increased in relation to that probability for that window so that an erasure becomes proportionally more likely.

While illustrative systems and methods as described herein embodying various aspects of the present disclosure are shown, it will be understood by those skilled in the art, that the invention is not limited to these embodiments. Modifications may be made by those skilled in the art, particularly in light of the foregoing teachings. For example, each of the elements of the aforementioned embodiments may be utilized alone or in combination or subcombination with elements of the other embodiments. It will also be appreciated and understood that modifications may be made without departing from the true spirit and scope of the present disclosure. The description is thus to be regarded as illustrative instead of restrictive on the present invention.

What is claimed is:

1. A method for determining bits in a convolutionally decoded output bit stream to be marked for erasure, the method comprising:
   comparing a last k-bits of a convolutionally encoded output bit stream with a corresponding k-bits of a delayed version of an input bit stream to a convolutional decoder, the last k-bits starting at a first bit and ending at first bit+k;
   for each bit of the last k-bits in the convolutionally encoded output bit stream and in the corresponding k-bits of the delayed version of the input bit stream, determining a number of, or a pattern of conflicting bits;
   determining whether the number of conflicting k-bits exceeds a first threshold number of conflicting k-bits;
   comparing a last p-bits of a convolutionally encoded output bit stream with a corresponding p-bits of a delayed version of an input bit stream to a convolutional decoder, the last p-bits starting at a first bit and ending at first bit+p;
   for each bit of the last p-bits in the convolutionally encoded output bit stream and in the corresponding p-bits of the delayed version of the input bit stream, determining a number of conflicting p-bits;
   determining whether the number of conflicting p-bits exceeds a second threshold number of conflicting bits; and
   determining whether any of the conflicting p-bits temporally overlap the conflicting k-bits.

2. The method of claim 1, further comprising prior to comparing, convolutionally encoding the output bit stream from the convolutional decoder.

3. The method of claim 1, the bits of the convolutionally coded bit stream further comprising being encoded by Gray coding, and if multiple bits of a Gray-coded symbol are in conflict declaring that symbol to be in conflict and adding a second time the numbers of conflicts in that symbol into the conflict count prior to threshold comparison.

4. The method of claim 1, further comprising:
   receiving, at the convolutional decoder, the input bit stream; and processing, by the convolutional decoder, the input bit stream to produce the output bit stream.

5. The method of claim 1, further comprising sending the output bit stream to a block decoding component for decoding with the bits marked for erasure.

6. The method of claim 5, the block decoding component comprises an erasure capable Reed-Solomon decoder.

7. The method of claim 1, k-bits are 8 bits.

8. The method of claim 1, further comprising marking for potential erasure any bits contained in the last k-bits where the first threshold was exceeded.

9. The method of claim 1, further comprising marking for erasure any bits contained in the last k-bits where the first threshold was exceeded, the second threshold was exceeded and the k-bits and p-bits are temporally overlapped.

10. The method of claim 1, further comprising:
    comparing a next k-bits of the convolutionally encoded output bit stream with the corresponding next k-bits of the delayed version of the input bit stream to the convolutional decoder, the next k-bits starting at first bit+j and ending at first bit+j+k;
    for each bit of the next k-bits in the convolutionally encoded output bit stream and in the corresponding next k-bits of the delayed version of the input bit stream, determining a second number of conflicting k-bits;
    determining whether the second number of conflicting bits exceeds a third threshold number of conflicting bits;
    comparing a next p-bits of the convolutionally encoded output bit stream with the corresponding next p-bits of the delayed version of the input bit stream to the convolutional decoder, the next j-bits starting at first bit+j and ending at first bit+j+p;

for each bit of the next p-bits in the convolutionally encoded output bit stream and in the corresponding next p-bits of the delayed version of the input bit stream, determining a second number of conflicting p-bits; and determining whether the second number of conflicting bits exceeds a fourth threshold number of conflicting p-bits.

11. The method of claim 10, the first and third threshold number of bits are a same number of bits.

12. The method of claim 10, wherein the second and fourth threshold number of bits are a same number of bits.

13. The method of claim 10, wherein k is 8 and j is 1.

14. An apparatus comprising:
at least one processor; and
at least one memory storing computer readable instructions that, when executed, cause the at least one processor to perform a method comprising:
comparing a last k-bits of a convolutionally encoded output bit stream with a corresponding k-bits of a delayed version of an input bit stream to a convolutional decoder, the last k-bits starting at a first bit and ending at first bit+k;
for each bit of the last k-bits in the convolutionally encoded output bit stream and in the corresponding k-bits of the delayed version of the input bit stream, determining a number of conflicting bits; and
determining whether the number of conflicting k-bits exceeds a first threshold number of conflicting k-bits;
comparing a last p-bits of a convolutionally encoded output bit stream with a corresponding p-bits of a delayed version of an input bit stream to a convolutional decoder, the last p-bits starting at a first bit and ending at first bit+p;
for each bit of the last p-bits in the convolutionally encoded output bit stream and in the corresponding p-bits of the delayed version of the input bit stream, determining a number of conflicting p-bits; and
determining whether the number of conflicting p-bits exceeds a second threshold number of conflicting bits.

15. The apparatus of claim 14, the bits of the convolutionally coded bit stream encoded by Gray coding.

16. The apparatus of claim 14, further comprising prior to comparing, convolutionally encoding the output bit stream from the convolutional decoder.

17. The apparatus of claim 14, further comprising:
receiving the input bit stream; and
processing the input bit stream to produce the output bit stream.

18. The apparatus of claim 14, further comprising sending the output bit stream to a block decoding component for decoding with the bits marked for erasure.

19. The apparatus of claim 18, the block decoding component comprises an erasure capable Reed-Solomon decoder.

20. The apparatus of claim 14, k-bits are 8 bits.

21. The apparatus of claim 14, further comprising marking for potential erasure any bits contained in the last k-bits where the first threshold was exceeded.

22. The apparatus of claim 14, further comprising marking for erasure any bits contained in the last k-bits where the first and second thresholds were exceeded and the conflicting k-bits and conflicting p-bits are temporally overlapped.

23. The apparatus of claim 14, further comprising:
comparing a next k-bits of the convolutionally encoded output bit stream with the corresponding next k-bits of the delayed version of the input bit stream to the convolutional decoder, the next k-bits starting at first bit+j and ending at first bit+j+k;
for each bit of the next k-bits in the convolutionally encoded output bit stream and in the corresponding next k-bits of the delayed version of the input bit stream, determining a second number of conflicting k-bits;
determining whether the second number of conflicting k-bits exceeds a third threshold number of conflicting bits;
comparing a next p-bits of the convolutionally encoded output bit stream with the corresponding next p-bits of the delayed version of the input bit stream to the convolutional decoder, the next p-bits starting at first bit+j and ending at first bit+j+p;
for each bit of the next p-bits in the convolutionally encoded output bit stream and in the corresponding next p-bits of the delayed version of the input bit stream, determining a second number of conflicting p-bits; and
determining whether the second number of conflicting p-bits exceeds a fourth threshold number of conflicting bits.

24. The apparatus of claim 23, wherein the first and second threshold number of bits are a same number of bits.

25. The apparatus of claim 23, wherein k is 8 and j is 1.

26. A method for determining bits in a convolutionally decoded output bit stream to be marked for erasure, the method comprising:
comparing a last k-bits of a convolutionally encoded output bit stream with a corresponding k-bits of a delayed version of an input bit stream to a convolutional decoder, the last k-bits starting at a first bit and ending at first bit+k;
for each bit of the last k-bits in the convolutionally encoded output bit stream and in the corresponding k-bits of the delayed version of the input bit stream, determining a number of, or pattern of, conflicting bits;
determining whether the number of, or pattern of, conflicting k-bits exceeds a first threshold number of, or threshold pattern-correlation of, conflicting k-bits;
comparing a last m-bits of the convolutionally encoded output bit stream with a corresponding m-bits of a delayed version of an input bit stream to a convolutional decoder, the last m-bits starting at a first bit and ending at first bit+m;
for each bit of the last m-bits in the convolutionally encoded output bit stream and in the corresponding m-bits of the delayed version of the input bit stream, determining a number of conflicting bits; and
determining whether the number of conflicting m-bits exceeds a first threshold number of conflicting m-bits.

27. The method of claim 26, the k-bits and the m-bits comprise different numbers of bits in the convolutionally encoded output bit stream.

28. The method of claim 26, the k-bits and the m-bits comprise the same number of bits in the convolutionally encoded output bit stream.

29. The method of claim 26, the first threshold number of conflicting k-bits and the first threshold number of conflicting m-bits comprise different numbers of bits.

30. The method of claim 26, the first threshold number of conflicting k-bits and the first threshold number of conflicting m-bits comprise a same number of bits.

* * * * *